US009640632B2

(12) United States Patent
Ritenour

(10) Patent No.: US 9,640,632 B2
(45) Date of Patent: May 2, 2017

(54) SEMICONDUCTOR DEVICE HAVING IMPROVED HEAT DISSIPATION

(71) Applicant: RF Micro Devices, Inc., Greensboro, NC (US)

(72) Inventor: Andrew P. Ritenour, Colfax, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/797,573

(22) Filed: Jul. 13, 2015

(65) Prior Publication Data

US 2015/0318376 A1 Nov. 5, 2015

Related U.S. Application Data

(62) Division of application No. 13/974,488, filed on Aug. 23, 2013, now Pat. No. 9,147,632.

(Continued)

(51) Int. Cl.
*H01L 29/66* (2006.01)
*H01L 23/34* (2006.01)
(Continued)

(52) U.S. Cl.
CPC .... *H01L 29/66462* (2013.01); *H01L 21/0254* (2013.01); *H01L 21/02378* (2013.01);
(Continued)

(58) Field of Classification Search
CPC ......... H01L 29/66462; H01L 21/76898; H01L 21/283; H01L 21/0254; H01L 21/02378;
(Continued)

(56) References Cited

U.S. PATENT DOCUMENTS 4,236,119 A 11/1980 Battjes
4,317,055 A 2/1982 Yoshida et al.
(Continued)

FOREIGN PATENT DOCUMENTS

EP 1187229 A1 3/2002
EP 1826041 A1 8/2007
(Continued)

OTHER PUBLICATIONS

Corrected/Supplemental Notice of Allowability for U.S. Appl. No. 13/957,698, mailed Nov. 4, 2015, 4 pages.
(Continued)

*Primary Examiner* — Fernando L Toledo
*Assistant Examiner* — Adam S Bowen
(74) *Attorney, Agent, or Firm* — Withrow & Terranova, P.L.L.C.

(57) ABSTRACT

A semiconductor device having improved heat dissipation is disclosed. The semiconductor device includes a semi-insulating substrate and epitaxial layers disposed on the semi-insulating substrate wherein the epitaxial layers include a plurality of heat conductive vias that are disposed through the epitaxial layers with the plurality of heat conductive vias being spaced along a plurality of finger axes that are aligned generally parallel across a surface of the epitaxial layers. The semiconductor device further includes an electrode having a plurality of electrically conductive fingers that are disposed along the plurality of finger axes such that the electrically conductive fingers are in contact with the first plurality of heat conductive vias.

10 Claims, 4 Drawing Sheets

Related U.S. Application Data

(60) Provisional application No. 61/693,076, filed on Aug. 24, 2012.

(51) Int. Cl.

| | | |
|---|---|---|
| *H01L 29/20* | (2006.01) | |
| *H01L 21/283* | (2006.01) | |
| *H01L 21/768* | (2006.01) | |
| *H01L 21/02* | (2006.01) | |
| *H01L 29/778* | (2006.01) | |
| *H01L 23/367* | (2006.01) | |
| *H01L 23/482* | (2006.01) | |
| *H01L 29/06* | (2006.01) | |

(52) U.S. Cl.
CPC ...... *H01L 21/283* (2013.01); *H01L 21/76898* (2013.01); *H01L 23/34* (2013.01); *H01L 23/3677* (2013.01); *H01L 23/4824* (2013.01); *H01L 29/2003* (2013.01); *H01L 29/66431* (2013.01); *H01L 29/7786* (2013.01); *H01L 29/0657* (2013.01); *H01L 29/0696* (2013.01); *H01L 2924/0002* (2013.01)

(58) Field of Classification Search
CPC ............. H01L 23/3677; H01L 23/4824; H01L 29/7786; H01L 23/34; H01L 29/66431; H01L 29/2003; H01L 2924/0002; H01L 29/0696; H01L 29/0657
USPC ........................................................ 257/76
See application file for complete search history.

(56) References Cited

U.S. PATENT DOCUMENTS

| | | | |
|---|---|---|---|
| 4,540,954 | A | 9/1985 | Apel |
| 4,543,535 | A | 9/1985 | Ayasli |
| 4,620,207 | A | 10/1986 | Calviello |
| 4,788,511 | A | 11/1988 | Schindler |
| 5,028,879 | A | 7/1991 | Kim |
| 5,046,155 | A | 9/1991 | Beyer et al. |
| 5,047,355 | A | 9/1991 | Huber et al. |
| 5,107,323 | A | 4/1992 | Knolle et al. |
| 5,118,993 | A | 6/1992 | Yang |
| 5,208,547 | A | 5/1993 | Schindler |
| 5,227,734 | A | 7/1993 | Schindler et al. |
| 5,306,656 | A | 4/1994 | Williams et al. |
| 5,361,038 | A | 11/1994 | Allen et al. |
| 5,365,197 | A | 11/1994 | Ikalainen |
| 5,389,571 | A | 2/1995 | Takeuchi et al. |
| 5,406,111 | A | 4/1995 | Sun |
| 5,414,387 | A | 5/1995 | Nakahara et al. |
| 5,485,118 | A | 1/1996 | Chick |
| 5,608,353 | A | 3/1997 | Pratt |
| 5,629,648 | A | 5/1997 | Pratt |
| 5,698,870 | A | 12/1997 | Nakano et al. |
| 5,742,205 | A | 4/1998 | Cowen et al. |
| 5,764,673 | A | 6/1998 | Kawazu et al. |
| 5,834,326 | A | 11/1998 | Miyachi et al. |
| 5,843,590 | A | 12/1998 | Miura et al. |
| 5,864,156 | A | 1/1999 | Juengling |
| 5,874,747 | A | 2/1999 | Redwing et al. |
| 5,880,640 | A | 3/1999 | Dueme |
| 5,914,501 | A | 6/1999 | Antle et al. |
| 5,949,140 | A | 9/1999 | Nishi et al. |
| 6,049,250 | A | 4/2000 | Kintis et al. |
| 6,064,082 | A | 5/2000 | Kawai et al. |
| 6,110,757 | A | 8/2000 | Udagawa |
| 6,130,579 | A | 10/2000 | Iyer et al. |
| 6,133,589 | A | 10/2000 | Krames et al. |
| 6,177,685 | B1 | 1/2001 | Teraguchi et al. |
| 6,191,656 | B1 | 2/2001 | Nadler |
| 6,229,395 | B1 | 5/2001 | Kay |
| 6,265,943 | B1 | 7/2001 | Dening et al. |
| 6,271,727 | B1 | 8/2001 | Schmukler |
| 6,285,239 | B1 | 9/2001 | Iyer et al. |
| 6,306,709 | B1 | 10/2001 | Miyagi et al. |
| 6,307,364 | B1 | 10/2001 | Augustine |
| 6,313,705 | B1 | 11/2001 | Dening et al. |
| 6,329,809 | B1 | 12/2001 | Dening et al. |
| 6,333,677 | B1 | 12/2001 | Dening |
| 6,342,815 | B1 | 1/2002 | Kobayashi |
| 6,356,150 | B1 | 3/2002 | Spears et al. |
| 6,369,656 | B2 | 4/2002 | Dening et al. |
| 6,369,657 | B2 | 4/2002 | Dening et al. |
| 6,373,318 | B1 | 4/2002 | Dohnke et al. |
| 6,376,864 | B1 | 4/2002 | Wang |
| 6,377,125 | B1 | 4/2002 | Pavio et al. |
| 6,384,433 | B1 | 5/2002 | Barratt et al. |
| 6,387,733 | B1 | 5/2002 | Holyoak et al. |
| 6,392,487 | B1 | 5/2002 | Alexanian |
| 6,400,226 | B2 | 6/2002 | Sato |
| 6,404,287 | B2 | 6/2002 | Dening et al. |
| 6,418,174 | B1 | 7/2002 | Benedict |
| 6,448,793 | B1 | 9/2002 | Barratt et al. |
| 6,455,877 | B1 | 9/2002 | Ogawa et al. |
| 6,455,925 | B1 | 9/2002 | Laureanti |
| 6,475,916 | B1 | 11/2002 | Lee et al. |
| 6,477,682 | B2 | 11/2002 | Cypher |
| 6,521,998 | B1 | 2/2003 | Teraguchi et al. |
| 6,525,611 | B1 | 2/2003 | Dening et al. |
| 6,528,983 | B1 | 3/2003 | Augustine |
| 6,560,452 | B1 | 5/2003 | Shealy |
| 6,566,963 | B1 | 5/2003 | Yan et al. |
| 6,589,877 | B1 | 7/2003 | Thakur |
| 6,593,597 | B2 | 7/2003 | Sheu |
| 6,608,367 | B1 | 8/2003 | Gibson et al. |
| 6,614,281 | B1 | 9/2003 | Baudelot et al. |
| 6,621,140 | B1 | 9/2003 | Gibson et al. |
| 6,624,452 | B2 | 9/2003 | Yu et al. |
| 6,627,552 | B1 | 9/2003 | Nishio et al. |
| 6,633,073 | B2 | 10/2003 | Rezvani et al. |
| 6,633,195 | B2 | 10/2003 | Baudelot et al. |
| 6,639,470 | B1 | 10/2003 | Andrys et al. |
| 6,656,271 | B2 | 12/2003 | Yonehara et al. |
| 6,657,592 | B2 | 12/2003 | Dening et al. |
| 6,660,606 | B2 | 12/2003 | Miyabayashi et al. |
| 6,701,134 | B1 | 3/2004 | Epperson |
| 6,701,138 | B2 | 3/2004 | Epperson et al. |
| 6,706,576 | B1 | 3/2004 | Ngo et al. |
| 6,720,831 | B2 | 4/2004 | Dening et al. |
| 6,723,587 | B2 | 4/2004 | Cho et al. |
| 6,724,252 | B2 | 4/2004 | Ngo et al. |
| 6,727,762 | B1 | 4/2004 | Kobayashi |
| 6,748,204 | B1 | 6/2004 | Razavi et al. |
| 6,750,158 | B2 | 6/2004 | Ogawa et al. |
| 6,750,482 | B2 | 6/2004 | Seaford et al. |
| 6,759,907 | B2 | 7/2004 | Orr et al. |
| 6,802,902 | B2 | 10/2004 | Beaumont et al. |
| 6,815,722 | B2 | 11/2004 | Lai et al. |
| 6,815,730 | B2 | 11/2004 | Yamada |
| 6,822,842 | B2 | 11/2004 | Friedrichs et al. |
| 6,861,677 | B2 | 3/2005 | Chen |
| 6,943,631 | B2 | 9/2005 | Scherrer et al. |
| 7,015,512 | B2 | 3/2006 | Park et al. |
| 7,026,665 | B1 | 4/2006 | Smart et al. |
| 7,033,961 | B1 | 4/2006 | Smart et al. |
| 7,042,150 | B2 | 5/2006 | Yasuda |
| 7,052,942 | B1 | 5/2006 | Smart et al. |
| 7,135,747 | B2 | 11/2006 | Allen et al. |
| 7,211,822 | B2 | 5/2007 | Nagahama et al. |
| 7,408,182 | B1 | 8/2008 | Smart et al. |
| 7,449,762 | B1 | 11/2008 | Singh |
| 7,459,356 | B1 | 12/2008 | Smart et al. |
| 7,557,421 | B1 | 7/2009 | Shealy et al. |
| 7,719,055 | B1 | 5/2010 | McNutt et al. |
| 7,768,758 | B2 | 8/2010 | Maier et al. |
| 7,804,262 | B2 | 9/2010 | Schuster et al. |
| 7,923,826 | B2 | 4/2011 | Takahashi et al. |
| 7,935,983 | B2 | 5/2011 | Saito et al. |
| 7,968,391 | B1 | 6/2011 | Smart et al. |
| 7,974,322 | B2 | 7/2011 | Ueda et al. |
| 8,017,981 | B2 | 9/2011 | Sankin et al. |

(56) References Cited

U.S. PATENT DOCUMENTS

| | | |
|---|---|---|
| 8,110,915 B2 | 2/2012 | Fowlkes et al. |
| 8,237,198 B2 | 8/2012 | Wu et al. |
| 8,405,068 B2 | 3/2013 | O'Keefe |
| 8,502,258 B2 | 8/2013 | O'Keefe |
| 8,530,978 B1 | 9/2013 | Chu et al. |
| 8,633,518 B2 | 1/2014 | Suh et al. |
| 8,692,294 B2 | 4/2014 | Chu et al. |
| 8,729,680 B2 | 5/2014 | Kobayashi et al. |
| 8,785,976 B2 | 7/2014 | Nakajima et al. |
| 8,937,338 B2 | 1/2015 | Chowdhury et al. |
| 8,988,097 B2 | 3/2015 | Ritenour |
| 9,070,761 B2 | 6/2015 | Johnson |
| 9,082,836 B2 | 7/2015 | Senda |
| 9,093,420 B2 | 7/2015 | Kobayashi et al. |
| 9,124,221 B2 | 9/2015 | Vetury et al. |
| 9,129,802 B2 | 9/2015 | Ritenour |
| 9,136,341 B2 | 9/2015 | Kobayashi et al. |
| 2001/0040246 A1 | 11/2001 | Ishii |
| 2001/0054848 A1 | 12/2001 | Baudelot et al. |
| 2002/0005528 A1 | 1/2002 | Nagahara |
| 2002/0031851 A1 | 3/2002 | Linthicum et al. |
| 2002/0048302 A1 | 4/2002 | Kimura |
| 2002/0079508 A1 | 6/2002 | Yoshida |
| 2003/0003630 A1 | 1/2003 | Iimura et al. |
| 2003/0122139 A1 | 7/2003 | Meng et al. |
| 2003/0160307 A1 | 8/2003 | Gibson et al. |
| 2003/0160317 A1 | 8/2003 | Sakamoto et al. |
| 2003/0206440 A1 | 11/2003 | Wong |
| 2003/0209730 A1 | 11/2003 | Gibson et al. |
| 2003/0218183 A1 | 11/2003 | Micovic et al. |
| 2004/0070003 A1 | 4/2004 | Gaska et al. |
| 2004/0130037 A1 | 7/2004 | Mishra et al. |
| 2004/0144991 A1 | 7/2004 | Kikkawa |
| 2004/0227211 A1 | 11/2004 | Saito et al. |
| 2004/0241916 A1 | 12/2004 | Chau et al. |
| 2005/0006639 A1 | 1/2005 | Dupuis et al. |
| 2005/0110042 A1 | 5/2005 | Saito et al. |
| 2005/0139868 A1 | 6/2005 | Anda |
| 2005/0145874 A1 | 7/2005 | Saxler |
| 2005/0189559 A1 | 9/2005 | Saito et al. |
| 2005/0189562 A1 | 9/2005 | Kinzer et al. |
| 2005/0194612 A1 | 9/2005 | Beach |
| 2005/0212049 A1 | 9/2005 | Onodera |
| 2005/0225912 A1 | 10/2005 | Pant et al. |
| 2005/0271107 A1 | 12/2005 | Murakami et al. |
| 2005/0274977 A1 | 12/2005 | Saito et al. |
| 2006/0003556 A1 | 1/2006 | Lee et al. |
| 2006/0043385 A1 | 3/2006 | Wang et al. |
| 2006/0043501 A1 | 3/2006 | Saito et al. |
| 2006/0054924 A1 | 3/2006 | Saito et al. |
| 2006/0068601 A1 | 3/2006 | Lee et al. |
| 2006/0124960 A1 | 6/2006 | Hirose et al. |
| 2006/0205161 A1 | 9/2006 | Das et al. |
| 2006/0243988 A1 | 11/2006 | Narukawa et al. |
| 2006/0244010 A1 | 11/2006 | Saxler |
| 2006/0246680 A1 | 11/2006 | Bhattacharyya |
| 2006/0249750 A1 | 11/2006 | Johnson et al. |
| 2006/0255377 A1 | 11/2006 | Tu |
| 2007/0026676 A1 | 2/2007 | Li et al. |
| 2007/0093009 A1 | 4/2007 | Baptist et al. |
| 2007/0138545 A1 | 6/2007 | Lin et al. |
| 2007/0158692 A1 | 7/2007 | Nakayama et al. |
| 2007/0164326 A1 | 7/2007 | Okamoto et al. |
| 2007/0205433 A1 | 9/2007 | Parikh et al. |
| 2007/0295985 A1 | 12/2007 | Weeks, Jr. et al. |
| 2008/0023706 A1 | 1/2008 | Saito et al. |
| 2008/0073752 A1 | 3/2008 | Asai et al. |
| 2008/0112448 A1 | 5/2008 | Ueda et al. |
| 2008/0121875 A1 | 5/2008 | Kim |
| 2008/0142837 A1* | 6/2008 | Sato ............ H01L 21/02639 257/190 |
| 2008/0179737 A1 | 7/2008 | Haga et al. |
| 2008/0190355 A1* | 8/2008 | Chen ............ C30B 23/00 117/3 |
| 2008/0217753 A1 | 9/2008 | Otani |
| 2008/0272382 A1 | 11/2008 | Kim et al. |
| 2008/0272422 A1 | 11/2008 | Min |
| 2008/0283821 A1 | 11/2008 | Park et al. |
| 2008/0308813 A1 | 12/2008 | Suh et al. |
| 2009/0072269 A1 | 3/2009 | Suh et al. |
| 2009/0090984 A1 | 4/2009 | Khan et al. |
| 2009/0146185 A1 | 6/2009 | Suh et al. |
| 2009/0146186 A1 | 6/2009 | Kub et al. |
| 2009/0166677 A1 | 7/2009 | Shibata et al. |
| 2009/0200576 A1 | 8/2009 | Saito et al. |
| 2009/0267078 A1 | 10/2009 | Mishra et al. |
| 2009/0273002 A1 | 11/2009 | Chiou et al. |
| 2009/0278137 A1 | 11/2009 | Sheridan et al. |
| 2010/0025657 A1 | 2/2010 | Nagahama et al. |
| 2010/0025737 A1 | 2/2010 | Ishikura |
| 2010/0109018 A1 | 5/2010 | Chen et al. |
| 2010/0133567 A1 | 6/2010 | Son |
| 2010/0187575 A1 | 7/2010 | Baumgartner et al. |
| 2010/0207164 A1 | 8/2010 | Shibata et al. |
| 2010/0230656 A1 | 9/2010 | O'Keefe |
| 2010/0230717 A1 | 9/2010 | Saito |
| 2010/0258898 A1 | 10/2010 | Lahreche |
| 2011/0017972 A1 | 1/2011 | O'Keefe |
| 2011/0025422 A1 | 2/2011 | Marra et al. |
| 2011/0031633 A1 | 2/2011 | Hsu et al. |
| 2011/0079771 A1 | 4/2011 | Kanamura et al. |
| 2011/0095337 A1 | 4/2011 | Sato |
| 2011/0101300 A1 | 5/2011 | O'Keefe |
| 2011/0108887 A1 | 5/2011 | Fareed et al. |
| 2011/0115025 A1* | 5/2011 | Okamoto ............ H01L 21/76898 257/368 |
| 2011/0127586 A1 | 6/2011 | Bobde et al. |
| 2011/0163342 A1 | 7/2011 | Kim et al. |
| 2011/0175142 A1 | 7/2011 | Tsurumi et al. |
| 2011/0199148 A1 | 8/2011 | Iwamura |
| 2011/0211289 A1 | 9/2011 | Kosowsky et al. |
| 2011/0242921 A1 | 10/2011 | Tran et al. |
| 2011/0290174 A1* | 12/2011 | Leonard ............ C30B 23/00 117/84 |
| 2012/0018735 A1 | 1/2012 | Ishii |
| 2012/0086497 A1 | 4/2012 | Vorhaus |
| 2012/0126240 A1 | 5/2012 | Won |
| 2012/0199875 A1 | 8/2012 | Bhalla et al. |
| 2012/0199955 A1 | 8/2012 | Sun |
| 2012/0211802 A1 | 8/2012 | Tamari |
| 2012/0218783 A1 | 8/2012 | Imada |
| 2012/0262220 A1 | 10/2012 | Springett |
| 2013/0032897 A1 | 2/2013 | Narayanan et al. |
| 2013/0277687 A1 | 10/2013 | Kobayashi et al. |
| 2013/0280877 A1 | 10/2013 | Kobayashi et al. |
| 2014/0117559 A1 | 5/2014 | Zimmerman et al. |
| 2014/0264266 A1 | 9/2014 | Li et al. |
| 2014/0264454 A1 | 9/2014 | Banerjee et al. |

FOREIGN PATENT DOCUMENTS

| | | |
|---|---|---|
| JP | H10242584 A | 9/1998 |
| JP | 2000031535 A | 1/2000 |
| JP | 2003332618 A | 11/2003 |
| JP | 2008148511 A | 6/2008 |
| JP | 2008258419 A | 10/2008 |
| KR | 20070066051 A | 6/2007 |
| WO | 2004051707 A3 | 6/2004 |
| WO | 2011162243 A1 | 12/2011 |

OTHER PUBLICATIONS

Notice of Allowance for U.S. Appl. No. 14/067,019, mailed Oct. 13, 2015, 6 pages.

Author Unknown, "CGHV1J006D: 6 W, 18.0 GHz, GaN HEMT Die," Cree, Inc., 2014, 9 pages.

Boutros, K.S., et al., "5W GaN MMIC for Millimeter-Wave Applications," 2006 Compound Semiconductor Integrated Circuit Symposium, Nov. 2006, pp. 93-95.

Chang, S.J. et al., "Improved ESD protection by combining InGaN—GaN MQW LEDs with GaN Schottky diodes," IEEE Electron Device Letters, Mar. 2003, vol. 24, No. 3, pp. 129-131.

(56) References Cited

OTHER PUBLICATIONS

Chao, C-H., et al., "Theoretical demonstration of enhancement of light extraction of flip-chip GaN light-emitting diodes with photonic crystals," Applied Physics Letters, vol. 89, 2006, 4 pages.

Cho, H., et al., "High Density Plasma Via Hole Etching in SiC," Journal of Vacuum Science & Technology A: Surfaces and Films, vol. 19, No. 4, Jul./Aug. 2001, pp. 1878-1881.

Darwish, A.M., et al., "Dependence of GaN HEMT Millimeter-Wave Performance on Temperature," IEEE Transactions on Microwave Theory and Techniques, vol. 57, No. 12, Dec. 2009, pp. 3205-3211.

Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.

Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.

Hibbard, D.L. et al., "Low Resistance High Reflectance Contacts to p-GaN Using Oxidized Ni/Au and Al or Ag," Applied Physics Letters, vol. 83, No. 2, Jul. 14, 2003, pp. 311-313.

Krüuger, Olaf, et al., "Laser-Assisted Processing of VIAs for AlGaN/GaN HEMTs on SiC Substrates," IEEE Electron Device Letters, vol. 27, No. 6, Jun. 2006, pp. 425-427.

Lee, S.J., "Study of photon extraction efficiency in InGaN light-emitting diodes depending on chip structures and chip-mount schemes," Optical Engineering, SPIE, Jan. 2006, vol. 45, No. 1, 14 pages.

Shchekin, O.B. et al., "High performance thin-film flip-chip InGaN—GaN light-emitting diodes," Applied Physics Letters, vol. 89, 071109, Aug. 2006, 4 pages.

Sheppard, S.T., et al., "High Power Demonstration at 10 GHz with GaN/AlGaN HEMT Hybrid Amplifiers," 2000 Device Research Conference, Conference Digest, Jun. 2000, pp. 37-38.

Wierer, J.J., et al., "High-power AlGaInN flip-chip light-emitting diodes," Applied Physics Letters, vol. 78, No. 22, May 28, 2001, pp. 3379-3381.

Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.

Windisch, R. et al., "Impact of texture-enhanced transmission on high-efficiency surface-textured light-emitting diodes," Applied Physics Letters, Oct. 8, 2001, vol. 79, No. 15, pp. 2315-2317.

Final Office Action for U.S. Appl. No. 10/620,205, mailed Dec. 16, 2004, 9 pages.

Non-Final Office Action for U.S. Appl. No. 10/620,205, mailed Jul. 23, 2004, 7 pages.

Non-Final Office Action for U.S. Appl. No. 10/620,205, mailed May 3, 2005, 10 pages.

Non-Final Office Action for U.S. Appl. No. 10/689,980, mailed Jan. 26, 2005, 7 pages.

Non-Final Office Action for U.S. Appl. No. 10/689,980, mailed May 12, 2005, 8 pages.

Non-Final Office Action for U.S. Appl. No. 11/397,279, mailed Oct. 31, 2007, 7 pages.

Notice of Allowance for U.S. Appl. No. 11/397,279, mailed Apr. 17, 2008, 7 pages.

Final Office Action for U.S. Appl. No. 10/689,979, mailed Jun. 29, 2005, 16 pages.

Non-Final Office Action for U.S. Appl. No. 10/689,979, mailed Jan. 11, 2005, 14 pages.

Notice of Allowance for U.S. Appl. No. 10/689,979, mailed Oct. 26, 2005, 6 pages.

Non-Final Office Action for U.S. Appl. No. 11/360,734, mailed Jan. 18, 2008, 10 pages.

Notice of Allowance for U.S. Appl. No. 11/360,734, mailed Aug. 7, 2008, 6 pages.

Final Office Action for U.S. Appl. No. 11/937,207, mailed Nov. 19, 2009, 9 pages.

Non-Final Office Action for U.S. Appl. No. 11/937,207, mailed Mar. 18, 2010, 10 pages.

Non-Final Office Action for U.S. Appl. No. 11/937,207, mailed May 29, 2009, 11 pages.

Notice of Allowance for U.S. Appl. No. 11/937,207, mailed Feb. 28, 2011, 8 pages.

Quayle Action for U.S. Appl. No. 11/937,207, mailed Nov. 24, 2010, 4 pages.

Final Office Action for U.S. Appl. No. 11/458,833, mailed Dec. 15, 2008, 13 pages.

Non-Final Office Action for U.S. Appl. No. 11/458,833, mailed Apr. 1, 2008, 10 pages.

Notice of Allowance for U.S. Appl. No. 11/458,833, mailed Mar. 9, 2009, 7 pages.

Non-Final Office Action for U.S. Appl. No. 13/795,926, mailed Dec. 19, 2014, 14 pages.

Non-Final Office Action for U.S. Appl. No. 13/942,998, mailed Nov. 19, 2014, 9 pages.

Non-Final Office Action for U.S. Appl. No. 13/871,526, mailed Dec. 16, 2014, 17 pages.

Invitation to Pay Fees for PCT/US2013/056105, mailed Nov. 5, 2013, 7 pages.

International Search Report and Written Opinion for PCT/US2013/056105, mailed Feb. 12, 2014, 15 pages.

Non-Final Office Action for U.S. Appl. No. 13/910,202, mailed Sep. 25, 2014, 9 pages.

Final Office Action for U.S. Appl. No. 13/910,202, mailed Jan. 20, 2015, 10 pages.

International Search Report and Written Opinion for PCT/US2013/056126, mailed Oct. 25, 2013, 10 pages.

Non-Final Office Action for U.S. Appl. No. 13/927,182, mailed May 1, 2014, 7 pages.

Final Office Action for U.S. Appl. No. 131927,182, mailed Sep. 17, 2014, 10 pages.

Non-Final Office Action for U.S. Appl. No. 13/974,488, mailed Oct. 28, 2014, 8 pages.

Lin, C.K. et al., "GaN Lattice Matched $ZnO/Pr_2O_3$ Film as Gate Dielectric Oxide Layer for AlGaN/GaN HEMT," IEEE International Conference of Electron Devices and Solid-State Circuits, EDSSC 2009, IEEE, Dec. 25-27, 2009, Xi'an, China, pp. 408-411.

Lin, H. C. et al., "Leakage current and breakdown electric-field studies on ultrathin atomic-layer-deposited $Al_2O_3$ on GaAs," Applied Physics Letters, vol. 87, 2005, pp. 182094-1 to 182094-3.

Lossy, R. et al., "Gallium nitride MIS-HEMT using atomic layer deposited Al2O3 as gate dielectric," Journal of Vacuum Science & Technology A: Vacuum, Surfaces, and Films, vol. 31, No. 1, Jan./Feb. 2013, 6 pages.

Seok, O. et al., "High-breakdown voltage and low on-resistance AlGaN/GaN on Si MOS-HEMTs employing an extended Tan gate on HfO2 gate insulator," Electronics Letters, vol. 49, No. 6, Institute of Engineering and Technology, Mar. 14, 2013, 2 pages.

Tang, K. et al., "Enhancement-mode GaN Hybrid MOS-HEMTs with Breakdown Voltage of 1300V," 21st International Symposium on Power Semiconductor Devices & IC's, ISPSD 2009, IEEE, Jun. 14-18, 2009, Barcelona, Spain, pp. 279-282.

Ye, P.D., et al., "GaN MOS-Hemt Using Atomic Layer Deposition Al2O3 as Gate Dielectric and Surface Passivation," International Journal of High Speed Electronics and Systems, vol. 14, No. 3, 2004, pp. 791-796.

Non-Final Office Action for U.S. Appl. No. 14/749,274, mailed Feb. 22, 2016, 6 pages.

Non-Final Office Action for U.S. Appl. No. 14/731,736, mailed Jan. 14, 2016, 10 pages.

Final Office Action for U.S. Appl. No. 14/557,940, mailed Feb. 8, 2016, 8 pages.

Huang, Xiucheng et al., "Analytical Loss Model of High Voltage GaN HEMT in Cascode Configuration," IEEE Transactions on Power Electronics, vol. 29, No. 5, May 2014, IEEE, pp. 2208-2219.

Lee, Han S., "GaN-on-Silicon-Based Power Switch in Sintered, Dual-Side Cooled Package," PowerElectronics.com, Jan. 2, 2013, 5

(56) References Cited

OTHER PUBLICATIONS pages, http://powerelectronics.com/discrete-power-semis/gan-silicon-based-power-switch-sintered-dual-side-cooled-package.
Liang, Zhenxian et al., "Embedded Power-An Integration Packaging Technology for IPEMs," The International Journal of Microcircuits and Electronic Packaging, vol. 23, No. 4, 2000, pp. 481-487.
Li, Xueqing et al., "Investigation of SiC Stack and Discrete Cascodes" PowerPoint Presentation, PCIM Europe, May 20-22, 2014, Nuremberg, Germany, 26 slides.
Stevanovic, Ljubisa D. et al., "Low Inductance Power Module with Blade Connector," 2010 Twenty-Fifth Annual IEEE Applied Power Electronics Conference and Exposition (APEC), Feb. 21-25, 2010, IEEE, Palm Springs, CA, pp. 1603-1609.
Liang, Zhenxian et al., "Embedded Power-A Multilayer Integration Technology for Packaging of IPEMs and PEBBs," Proceedings of International Workshop on Integrated Power Packaging, Jul. 14-16, 2000, IEEE, pp. 41-45.
Notice of Allowance for U.S. Appl. No. 13/914,060, mailed Nov. 13, 2014, 8 pages.
Non-Final Office Action for U.S. Appl. No. 13/966,400, mailed Sep. 3, 2014, 9 pages.
Final Office Action for U.S. Appl. No. 13/966,400, mailed Dec. 3, 2014, 8 pages.
Non-Final Office Action for U.S. Appl. No. 13/957,698, mailed Nov. 5, 2014, 11 pages.
International Search Report and Written Opinion for PCT/US2013/056132, mailed Oct. 10, 2013, 11 pages.
Final Office Action for U.S. Appl. No. 13/973,482, mailed Nov. 5, 2014, 9 pages.
International Search Report and Written Opinion for PCT/US2013/056187, mailed Oct. 10, 2013, 11 pages.
Non-Final Office Action for U.S. Appl. No. 13/973,482, mailed May 23, 2014, 8 pages.
Non-Final Office Action for U.S. Appl. No. 13/795,986, mailed Apr. 24, 2014, 13 pages.
Final Office Action for U.S. Appl. No. 13/795,986, mailed Dec. 5, 2014, 16 pages.
International Search Report for GB0902558.6, issued Jun. 15, 2010, by the UK Intellectual Property Office, 2 pages.
Examination Report for British Patent Application No. 0902558.6, mailed Nov. 16, 2012, 5 pages.
Examination Report for British Patent Application No. GB0902558.6, issued Feb. 28, 2013, 2 pages.
Non-Final Office Action for U.S. Appl. No. 12/705,869, mailed Feb. 9, 2012, 10 pages.
Notice of Allowance for U.S. Appl. No. 12/705,869, mailed Apr. 4, 2013, 9 pages.
Notice of Allowance for U.S. Appl. No. 12/705,869, mailed Jul. 19, 2012, 8 pages.
Advisory Action for U.S. Appl. No. 12/841,225, mailed Apr. 16, 2012, 3 pages.
Final Office Action for U.S. Appl. No. 12/841,225 mailed Feb. 1, 2012, 9 pages.
Non-Final Office Action for U.S. Appl. No. 12/841,225, mailed May 2, 2012, 10 pages.
Non-Final Office Action for U.S. Appl. No. 12/841,225 mailed Dec. 22, 2011, 8 pages.
Non-Final Office Action for U.S. Appl. No. 12/841,257 mailed Jan. 5, 2012, 13 pages.
Notice of Allowance for U.S. Appl. No. 13/795,926, mailed Apr. 27, 2015, 8 pages.
Notice of Allowance for U.S. Appl. No. 13/942,998, mailed Apr. 27, 2015, 8 pages.

Final Office Action for U.S. Appl. No. 13/871,526, mailed Jun. 17, 2015, 11 pages.
Advisory Action for U.S. Appl. No. 13/871,526, mailed Sep. 3, 2015, 3 pages.
International Preliminary Report on Patentability for PCT/US2013/056105, mailed Mar. 5, 2015, 12 pages.
Advisory Action for U.S. Appl. No. 13/910,202, mailed Apr. 6, 2015, 3 pages.
Notice of Allowance for U.S. Appl. No. 13/910,202, mailed May 14, 2015, 9 pages.
International Preliminary Report on Patentability for PCT/US2013/056126, mailed Mar. 5, 2015, 7 pages.
Final Office Action for U.S. Appl. No. 13/974,488, mailed Feb. 20, 2015, 8 pages.
Notice of Allowance for U.S. Appl. No. 13/974,488, mailed May 29, 2015, 9 pages.
Notice of Allowance for U.S. Appl. No. 13/966,400, mailed Feb. 20, 2015, 8 pages.
Notice of Allowance for U.S. Appl. No. 13/957,698, mailed Mar. 30, 2015, 7 pages.
Corrected/Supplemental Notice of Allowability for U.S. Appl. No. 13/957,689, mailed May 20, 2015, 3 pages.
Corrected/Supplement Notice of Allowability for U.S. Appl. No. 13/957,689, mailed Jun. 9, 2015, 4 pages.
Notice of Allowance for U.S. Appl. No. 13/957,698, mailed Jul. 20, 2015, 7 pages.
Non-Final Office Action for U.S. Appl. No. 14/557,940, mailed Aug. 31, 2015, 8 pages.
International Preliminary Report on Patentability for PCT/US2013/056132, mailed Mar. 5, 2015, 9 pages.
International Preliminary Report on Patentability for PCT/US2013/056187, mailed Mar. 12, 2015, 9 pages.
Notice of Allowance for U.S. Appl. No. 13/973,482, mailed May 4, 2015, 7 pages.
Notice of Allowance for U.S. Appl. No. 13/795,986, mailed Mar. 6, 2015, 8 pages.
Non-Final Office Action for U.S. Appl. No. 14/067,019, mailed Mar. 25, 2015, 7 pages.
Advisory Action for U.S. Appl. No. 10/620,205, mailed Feb. 15, 2005, 2 pages.
Notice of Allowance for U.S. Appl. No. 10/620,205, mailed Dec. 8, 2005, 4 pages.
Notice of Allowance for U.S. Appl. No. 12/841,225, mailed Nov. 9, 2012, 5 pages.
Non-Final Office Action for U.S. Appl. No. 13/871,526, mailed Mar. 8, 2016, 13 pages.
Notice of Allowance for U.S. Appl. No. 14/731,736, mailed May 9, 2016, 8 pages.
Final Office Action for U.S. Appl. No. 14/749,274, mailed Jun. 23, 2016, 6 pages.
Notice of Allowance for U.S. Appl. No. 14/749,274, mailed Aug. 15, 2016, 7 pages.
Notice of Allowance for U.S. Appl. No. 14/847,558, mailed Aug. 8, 2016, 9 pages.
Final Office Action for U.S. Appl. No. 13/871,526, mailed Aug. 30, 2016, 14 pages.
Advisory Action and Examiner-Initiated Interview Summary for U.S. Appl. No. 13/871,526, mailed Oct. 31, 2016, 4 pages.
Advisory Action and Examiner-Initiated Interview Summary for U.S. Appl. No. 13/871,526, mailed Nov. 18, 2016, 5 pages.
Non-Final Office Action for U.S. Appl. No. 13/871,526, mailed Jan. 5, 2017, 15 pages.

\* cited by examiner

SEMICONDUCTOR DEVICE HAVING IMPROVED HEAT DISSIPATION

RELATED APPLICATIONS

This application is a Divisional of U.S. patent application Ser. No. 13/974,488, filed Aug. 23, 2013, now U.S. Pat. No. 9,147,632, which claims the benefit of U.S. provisional patent application No. 61/693,076, filed Aug. 24, 2012, the disclosures of which are incorporated herein by reference in their entireties.

FIELD OF THE DISCLOSURE

The present disclosure relates to heat dissipation in semiconductor devices used in power applications.

BACKGROUND

An important property for semiconductor devices used in power applications is thermal resistance, which is a property of a material that is associated with heat conductivity. For example, a material with a high thermal resistance is not a good conductor of heat, whereas a material with a low thermal resistance will conduct heat relatively well. The thermal resistance of certain regions within a semiconductor device will directly determine the maximum heat dissipation of the semiconductor device for a given junction temperature rating. Consequently, it is desirable to minimize the thermal resistance of certain locations within a semiconductor device in order to dissipate heat.

FIG. 1A is a cross-sectional view of a prior art gallium nitride (GaN) high electron mobility transistor (HEMT) 10 depicting a buffer layer 12 between GaN device layers 14 and a semi-insulating substrate 16. The buffer layer 12 and the GaN device layers 14 make up epitaxial layers 18. A source electrode 20, a gate electrode 22 and a drain electrode 24 are disposed onto a surface 26 of the epitaxial layers 18. Heat dissipated in the GaN HEMT 10 must flow through the epitaxial layers 18 to reach the semi-insulating substrate 16, which is selected of a material that provides a relatively low thermal resistivity. For example, the bulk thermal conductivity of GaN is 1.3 W/cm·K compared to a thermal conductivity of around about 3.6 W/cm·K to around about 4.9 W/cm·K for various silicon carbide (SiC) polytypes. Therefore, SiC is a desirable material for the semi-insulating substrate 16. However, due to a lattice mismatch between GaN and common substrates such as SiC, silicon (Si), and Sapphire, a GaN nucleation along with the buffer layer 12 have a high dislocation density, which significantly increases the thermal resistivity of the epitaxial layers 18.

FIG. 1B is a plan view of the prior art GaN HEMT 10 depicting through-wafer vias 28 that are electrically coupled to a bus 30 of the source electrode 20 near the periphery of a die 32. The location of the through-wafer vias 28 prevents the through-wafer vias 28 from efficiently dissipating the heat generated by the GaN HEMT 10 because the largest heat density occurs within a central region of the die 32 in close proximity to drain fingers 34 that are interdigitated with source fingers 36, and gate fingers 38. As a result, there remains a need for a semiconductor device having a structure that dissipates heat with a relatively greater efficiency.

SUMMARY

A semiconductor device having improved heat dissipation is disclosed. The semiconductor device includes a semi-insulating substrate and epitaxial layers disposed on the semi-insulating substrate wherein the epitaxial layers include a plurality of heat conductive vias that are disposed through the epitaxial layers with the plurality of heat conductive vias being spaced along a plurality of finger axes that are aligned generally parallel across a surface of the epitaxial layers. The semiconductor device further includes an electrode having a plurality of electrically conductive fingers that are disposed along the plurality of finger axes such that the electrically conductive fingers are in contact with the first plurality of heat conductive vias. An advantage of the disclosed semiconductor device is that a greater heat density generated within the epitaxial layers is dissipated more efficiently through the plurality of heat conductive vias because they are located where a majority of the heat is generated.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in,"

or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures. Moreover, the term high resistivity and the term semi-insulating are used interchangeably throughout the disclosure. Furthermore, the term semi-insulating refers to being electrically insulating.

Figure 1A:
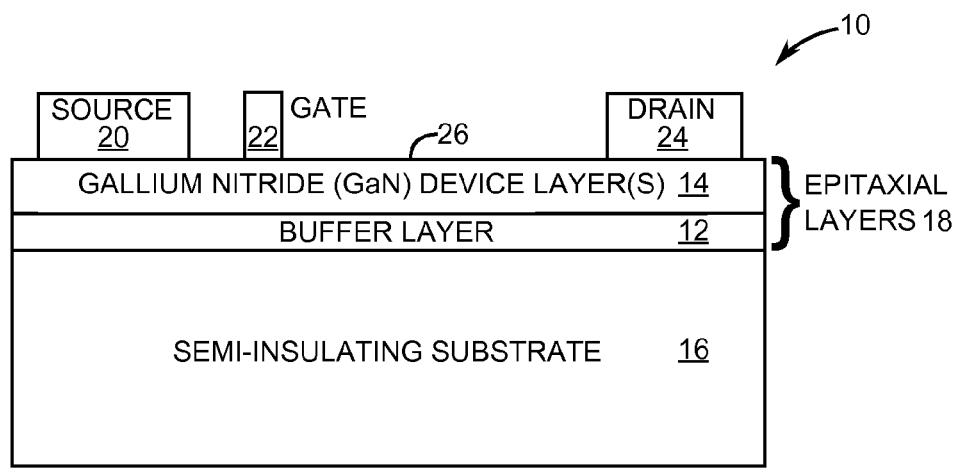
FIG. 1A is a cross-sectional view of a prior art gallium nitride (GaN) high electron mobility transistor (HEMT) depicting a buffer layer between GaN device layers and a semi-insulating substrate.
Figure 1B:
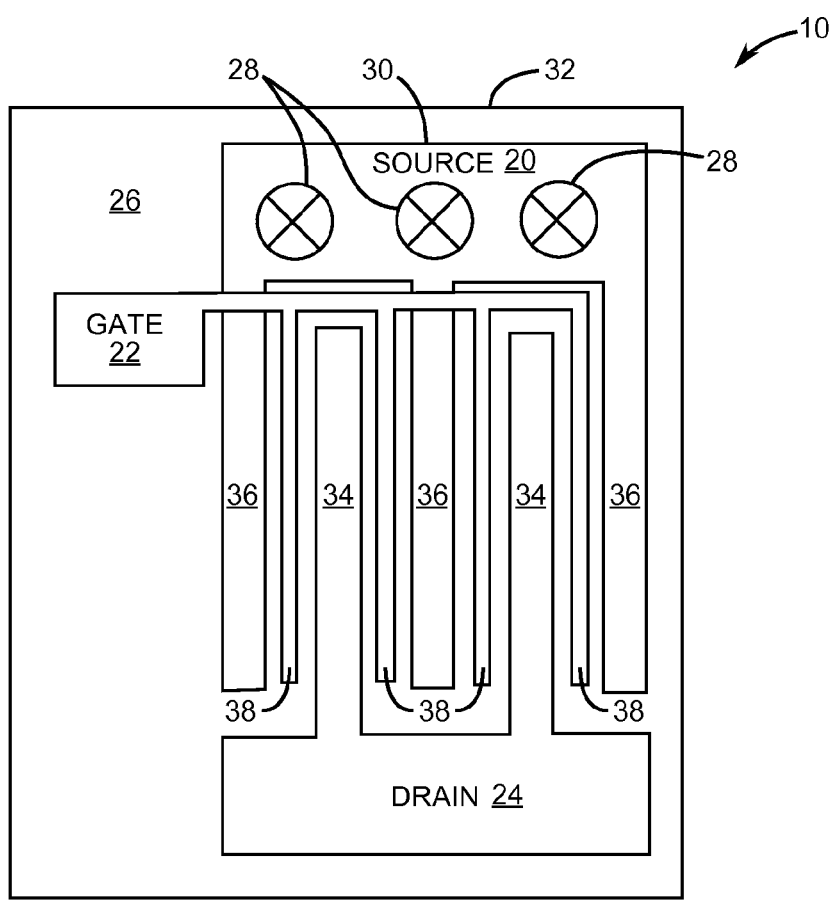
FIG. 1B is a plan view of the prior art GaN HEMT depicting through-wafer vias electrically coupled to a bus of the source electrode near the edge of a die periphery.
Figure 2A:
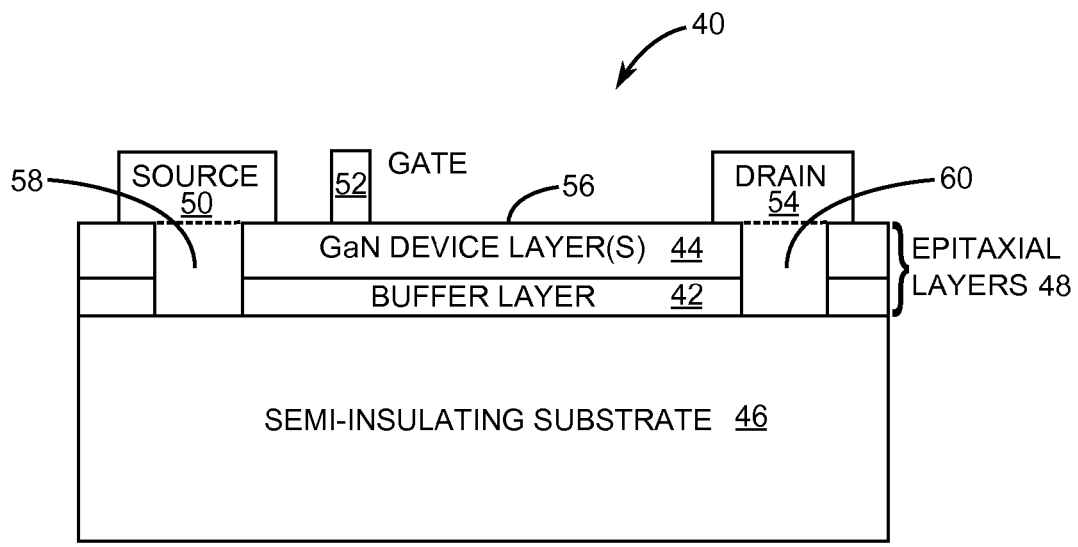
FIG. 2A is a cross-sectional view of an exemplary semiconductor device in the form of a GaN HEMT having heat conductive vias coupled to drain and source electrodes in accordance with the present disclosure.

FIG. 2A is a cross-sectional view of an exemplary semiconductor device 40 in the form of a GaN HEMT with a buffer layer 42 between GaN device layer(s) 44 and a semi-insulating substrate 46. The buffer layer 42 and the GaN device layer(s) 44 make up epitaxial layers 48. A source electrode 50, a gate electrode 52 and a drain electrode 54 are disposed onto a surface 56 of the epitaxial layers 48. FIG. 2A also shows one of a first plurality of heat conductive vias 58 that that are disposed through the epitaxial layers 48 to collectively thermally couple the source electrode 50 to the semi-insulating substrate 46. Similarly, FIG. 2A further shows one of a second plurality of heat conductive vias 60 that are disposed through the epitaxial layers 48 to collectively thermally couple the drain electrode 54 to the semi-insulating substrate 46.

The semi-insulating substrate 46 has a bulk electrical resistivity that ranges from around about $10^7$ ohm-cm to around about $10^{12}$ ohm-cm. As a result of this high bulk resistivity range, no significant electrical current flows through the semi-insulating substrate 46 between the source electrode 50 and the drain electrode 54. Suitable materials for the semi-insulating substrate 46 include, but are not limited to high electrical resistivity silicon carbon (SiC), silicon (Si), gallium nitride (GaN), zinc oxide (ZnO), aluminum oxide ($Al_2O_3$), and gallium oxide ($Ga_2O_3$).

Figure 2B:
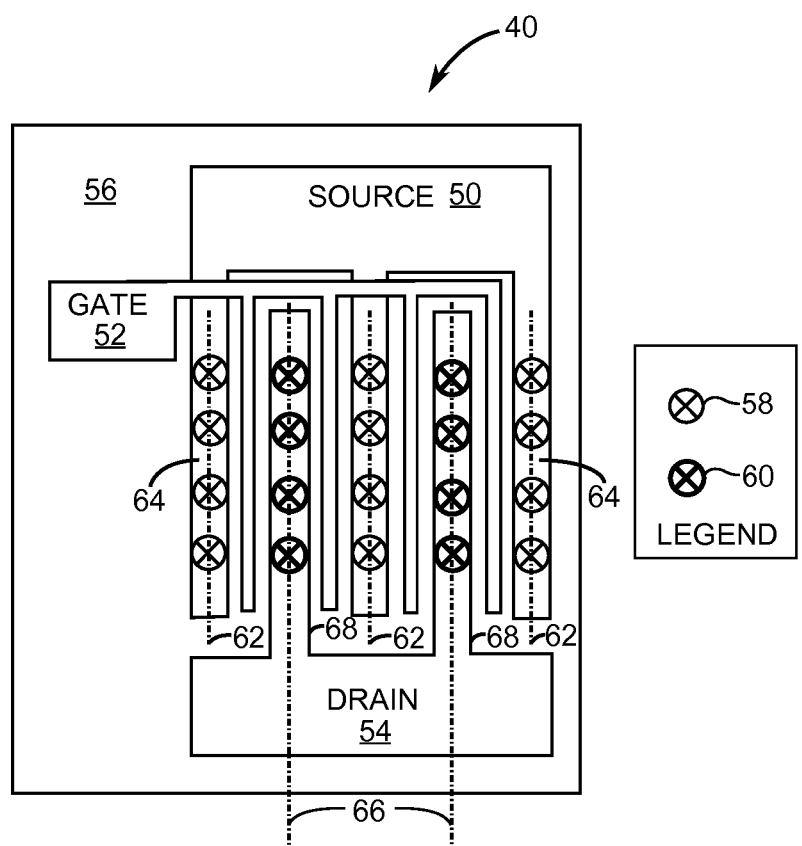
FIG. 2B is a plan view of the GaN HEMT of FIG. 2A showing pluralities of heat conductive vias in contact with drain and source fingers.

FIG. 2B is a plan view of the semiconductor device 40 of FIG. 2A showing the first plurality of the heat conductive vias 58 being spaced along a first plurality of finger axes 62 that are aligned generally parallel across the surface 56 of the epitaxial layers 48. The source electrode 50 includes a first plurality of electrically conductive fingers 64 that are disposed along the first plurality of finger axes 62 such that the first plurality of electrically conductive fingers 64 are in contact with the first plurality of the heat conductive vias 58. Each of the second plurality of the heat conductive vias 60 are spaced along a second plurality of finger axes 66 that are interdigitated with the first plurality of finger axes 62. The drain electrode 54 includes a second plurality of electrically conductive fingers 68 that are disposed along the second plurality of finger axes 66 such that the second plurality of electrically conductive fingers 68 is in contact with the second plurality of the heat conductive vias 60. Excess heat generated around the first plurality of electrically conductive fingers 64 and the second plurality of electrically conductive fingers 68 is relatively efficiently conducted through the first plurality of the heat conductive vias 58 and the second plurality of the heat conductive vias 60 to the semi-insulating substrate 46 where the excess heat is dissipated.

Figure 3:
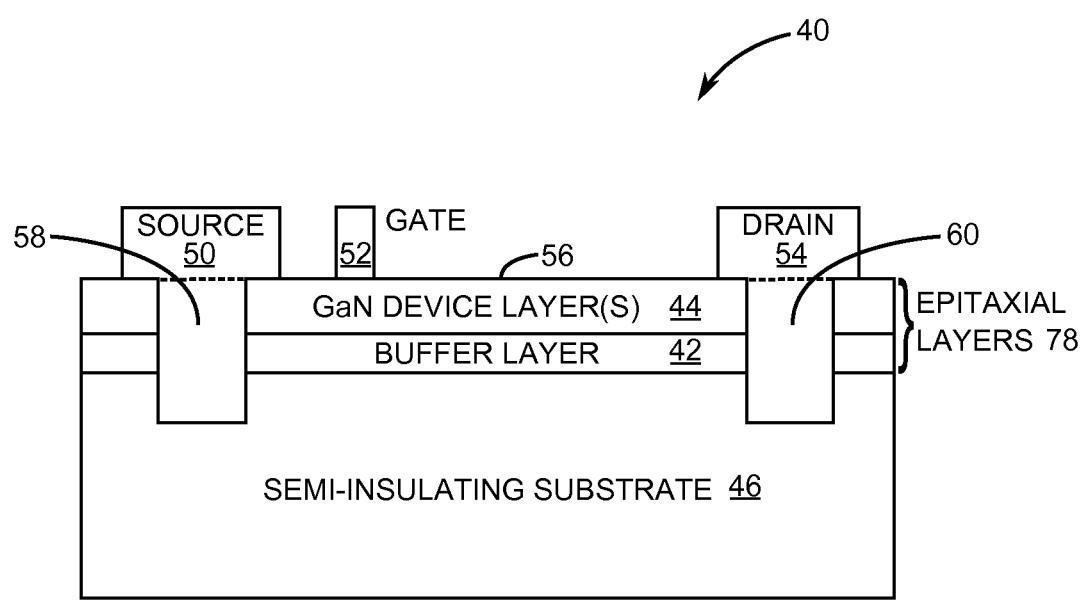
FIG. 3 is a cross-sectional view of an exemplary embodiment of a semiconductor device in the form of a GaN HEMT in which heat conductive vias are further extended into a semi-insulating substrate.

FIG. 3 is a cross-sectional view of an exemplary embodiment of the semiconductor device 40 in which the first plurality of the heat conductive vias 58 and the second plurality of the heat conductive vias 60 are further extended into a semi-insulating substrate 46. By extending the first plurality of the heat conductive vias 58 and the second plurality of the heat conductive vias 60 into the semi-insulating substrate 46, even greater heat dissipation can be realized.

Figure 4A:
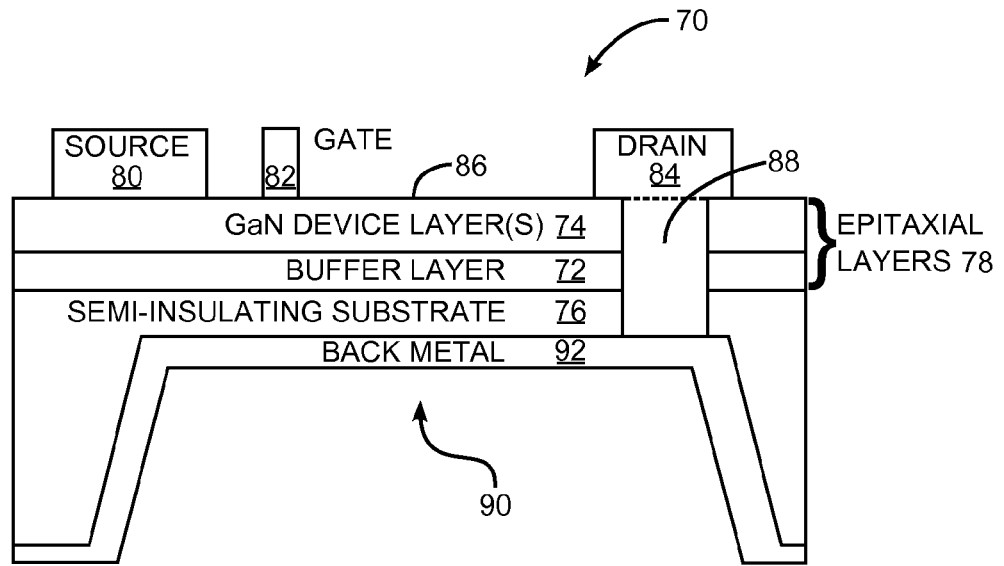
FIG. 4A is a cross-sectional view of an exemplary embodiment of a semiconductor device in the form of a GaN HEMT having through-wafer vias that provide an electrical connection to heat conductive vias.

FIG. 4A is a cross-sectional view of an exemplary semiconductor device 70 in the form of a GaN HEMT with a buffer layer 72 between GaN device layer(s) 74 and a semi-insulating substrate 76. The buffer layer 72 and the GaN device layer(s) 74 make up epitaxial layers 78. A source electrode 80, a gate electrode 82 and a drain electrode 84 are disposed onto a surface 86 of the epitaxial layers 78. FIG. 4A shows one of a plurality of heat conductive vias 88 that are disposed through the epitaxial layers 78 to collectively thermally couple the drain electrode 84 to the semi-insulating substrate 76. In addition, FIG. 4A shows one of a plurality of through hole vias 90 disposed into the semi-insulating substrate 76 to collectively thermally and electrically couple the drain electrode 84 to a back metal 92. Through hole vias 90 are relatively large compared to heat conductive vias 88 therefore direct contact between through hole vias 90 and drain electrode 84 would require relatively wider drain electrodes 84 which would undesirably increase chip size.

Figure 4B:
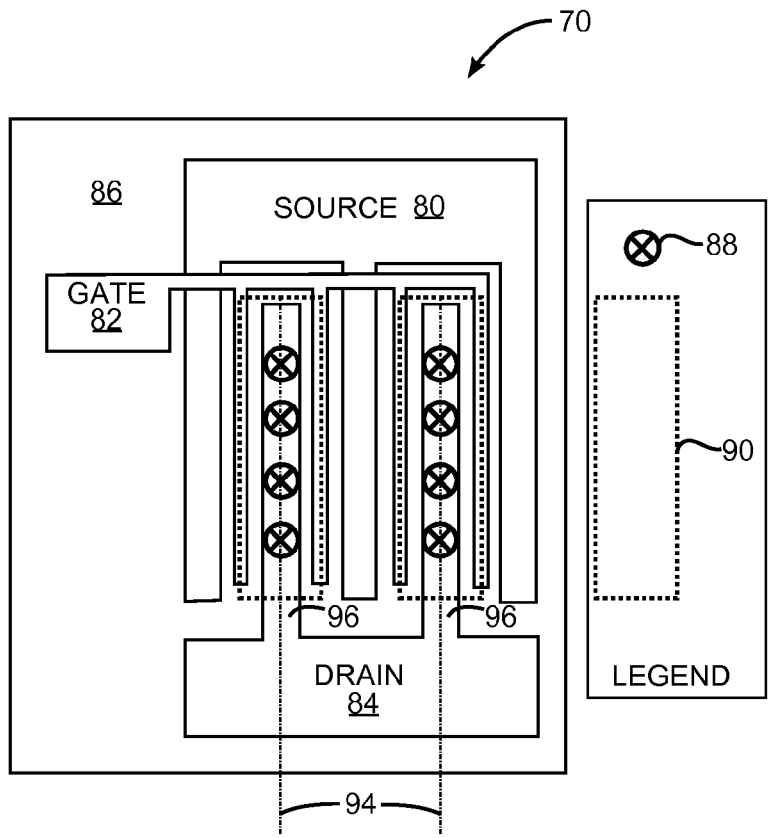
FIG. 4B is a plan view of the GaN HEMT of FIG. 4A showing a plurality of heat conductive vias in contact with drain fingers and the through-wafer vias.

FIG. 4B is a plan view of the semiconductor device 70 of FIG. 4A showing the plurality of the heat conductive vias 88 being spaced along a plurality of finger axes 94 that are aligned generally parallel across the surface 86 of the epitaxial layers 78. The drain electrode 84 includes a plurality of electrically conductive fingers 96 that are disposed along the plurality finger axes 94 such that the plurality of electrically conductive fingers 96 are in contact with the plurality of the heat conductive vias 88. In this exemplary embodiment, each of the plurality of heat conductive vias 88 are filled with an electrically conductive material such as metal. Excess heat generated around the plurality of electrically conductive fingers 96 is relatively efficiently conducted through the plurality of the heat conductive vias 88 to the semi-insulating substrate 76 and the back metal 92 where the excess heat is dissipated. While FIGS. 4A and 4B only show the drain being electrically and thermally coupled to the back metal 92 it is to be understood that the drain and/or source can be routed to the back metal 92 to improve thermal and/or electrical performance while reducing die area by eliminating a need for bond pads (not shown) on the front side of a die.

Those skilled in the art will recognize improvements and modifications to the embodiments of the present disclosure. All such improvements and modifications are considered within the scope of the concepts disclosed herein and the claims that follow.

What is claimed is:
1. A method of fabricating a semiconductor device having improved heat dissipation comprising:
    providing a semi-insulating substrate;
    disposing epitaxial layers on the semi-insulating substrate;

disposing a plurality of heat conductive vias through the epitaxial layers with the plurality of heat conductive vias being arranged in rows that are aligned parallel to a plurality of finger axes that are aligned generally parallel across a surface of the epitaxial layers; and disposing an electrode with a plurality of electrically conductive fingers along the plurality of finger axes such that individual ones of the plurality of electrically conductive fingers extend over corresponding rows of the plurality of heat conductive vias and are in contact with the plurality of heat conductive vias.

2. The method of claim 1 further including disposing a second plurality of heat conductive vias through the epitaxial layers with the second plurality of heat conductive vias being arranged in rows that are aligned parallel to a second plurality of finger axes that are interdigitated with the plurality of finger axes, and disposing a second electrode with a second plurality of electrically conductive fingers along the second plurality of finger axes such that individual rows of the second plurality of electrically conductive fingers extend over corresponding rows of the second plurality of heat conductive vias and are in contact with the second plurality of heat conductive vias.

3. The method of claim 1 further including extending the plurality of heat conductive vias into the semi-insulating substrate.

4. The method of claim 1 further including filling the plurality of heat conductive vias with an electrically conductive material.

5. The method of claim 4 further disposing a through-hole via into the semi-insulating substrate to electrically couple and thermally couple the plurality of heat conductive vias to a back metal.

6. The method of claim 1 wherein the semi-insulating substrate is made of silicon carbide (SiC) polytypes.

7. The method of claim 6 wherein the SiC polytypes have a bulk thermal conductivity that ranges from around about 3.6 W/cm·K to around about 4.9 W/cm·K.

8. The method of claim 1 wherein a bulk electrical resistivity of the semi-insulating substrate ranges from around about $10^7$ ohm-cm to around about $10^{12}$ ohm-cm.

9. The method of claim 8 further including selecting material for making up the semi-insulating substrate from at least one member of the group consisting of SiC, silicon (Si), GaN, zinc oxide (ZnO), aluminum oxide ($Al_2O_3$), and gallium oxide ($Ga_2O_3$).

10. The method of claim 1 wherein the semiconductor device is a GaN HEMT.

* * * * *